United States Patent
Yuan et al.

(10) Patent No.: US 8,169,228 B2
(45) Date of Patent: May 1, 2012

(54) CHIP TESTING CIRCUIT

(75) Inventors: Der-Min Yuan, Taipei County (TW);
Yi-Hao Chang, Taipei (TW); Peng-Yu Chen, Hsin Chu (TW)

(73) Assignee: Etron Technology, Inc., Hsin Chu (TW)

( * ) Notice: Subject to any disclaimer, the term of this patent is extended or adjusted under 35 U.S.C. 154(b) by 0 days.

(21) Appl. No.: 12/877,510

(22) Filed: Sep. 8, 2010

(65) Prior Publication Data

US 2011/0156742 A1    Jun. 30, 2011

(30) Foreign Application Priority Data

Dec. 30, 2009 (TW) ................. 98145712 A

(51) Int. Cl.
*G01R 31/3187* (2006.01)

(52) U.S. Cl. ............... 324/750.3; 324/762.01; 324/537; 702/117; 702/120; 702/122; 365/201

(58) Field of Classification Search .............. 324/763.02
See application file for complete search history.

(56) References Cited

U.S. PATENT DOCUMENTS

| | | | |
|---|---|---|---|
| 4,686,456 A * | 8/1987 | Furuyama et al. | 714/722 |
| 6,591,384 B1 * | 7/2003 | Chou | 714/718 |
| 6,876,217 B2 * | 4/2005 | Dankowski et al. | 324/762.01 |
| 7,562,269 B2 * | 7/2009 | Yoshida et al. | 714/719 |
| 7,706,199 B2 * | 4/2010 | Ku et al. | 365/201 |
| 7,910,588 B2 * | 3/2011 | Badescu et al. | 514/252.11 |
| 7,940,588 B2 * | 5/2011 | Yuan et al. | 365/201 |

* cited by examiner

*Primary Examiner* — Huy Q Phan
*Assistant Examiner* — Richard Isla Rodas
(74) *Attorney, Agent, or Firm* — Muncy, Geissler, Olds & Lowe, PLLC

(57) ABSTRACT

A chip testing circuit is disclosed. The chip testing circuit uses a judging circuit to switch the connection of the data compressing circuit between data compressing base units which compresses 4 XIOs, so as to obtain testing data by one single interface circuit and to increase the testing throughput.

19 Claims, 4 Drawing Sheets

| CS2 | i4 | i5 | i6 | i7 |
|---|---|---|---|---|
| 0 | 0 | 0 | 0 | 0 |
| 1 | 1 | 0 | 0 | 0 |
| 1 | 0 | 1 | 0 | 0 |
| 1 | 1 | 1 | 0 | 0 |
| 1 | 0 | 0 | 1 | 0 |
| 1 | 1 | 0 | 1 | 0 |
| 1 | 0 | 1 | 1 | 0 |
| 1 | 1 | 1 | 1 | 0 |
| 1 | 0 | 0 | 0 | 1 |
| 1 | 1 | 0 | 0 | 1 |
| 1 | 0 | 1 | 0 | 1 |
| 1 | 1 | 1 | 0 | 1 |
| 1 | 0 | 0 | 1 | 1 |
| 1 | 1 | 0 | 1 | 1 |
| 1 | 0 | 1 | 1 | 1 |
| 0 | 1 | 1 | 1 | 1 |

| CS1 | i1 | i2 | i3 | i4 |
|---|---|---|---|---|
| 0 | 0 | 0 | 0 | 0 |
| 1 | 1 | 0 | 0 | 0 |
| 1 | 0 | 1 | 0 | 0 |
| 1 | 1 | 1 | 0 | 0 |
| 1 | 0 | 0 | 1 | 0 |
| 1 | 1 | 0 | 1 | 0 |
| 1 | 0 | 1 | 1 | 0 |
| 1 | 1 | 1 | 1 | 0 |
| 1 | 0 | 0 | 0 | 1 |
| 1 | 1 | 0 | 0 | 1 |
| 1 | 0 | 1 | 0 | 1 |
| 1 | 1 | 1 | 0 | 1 |
| 1 | 0 | 0 | 1 | 1 |
| 1 | 1 | 0 | 1 | 1 |
| 1 | 0 | 1 | 1 | 1 |
| 0 | 1 | 1 | 1 | 1 |

Fig.2

CHIP TESTING CIRCUIT

BACKGROUND OF THE INVENTION (a) Field of the Invention

The invention relates to a chip data compressing test multiplexing circuit, particularly to a chip data compressing test multiplexing circuit for increasing testing throughput.

(b) Description of the Related Art

An integrate circuit (IC) is one of essential electronic elements for an information appliance because of its great functionality and compact size. In order to assure the functionality of a chip, the chip is required to pass comprehensive tests. Generally, the test method is to input a known testing signal into the circuit in the chip and acquire a feedback signal from the circuit of the chip to thereby determine whether the chip functions normally or not.

However, in order to correctly test a chip, the architecture of the chip testing circuit according to the prior art, for example one cycle IO compress 8 read circuit to test 8 signals at once, should have two pins only for testing and two interface circuits connecting to two probes of the chip testing system. Thus, the number of pins for testing is increased and thereby the cost of the chip testing circuit is also increased. If the chip testing rate is to be increased, the number of probes should be increased as well. It results in the increase of the whole production cost.

BRIEF SUMMARY OF THE INVENTION

In light of the above-mentioned problems, one object of the invention is to provide a chip testing circuit to decrease the usage of the number of pins and increase the chip testing rate to decrease the production cost.

In order to achieve the above purpose, one embodiment of the invention provides a chip testing circuit, comprising a plurality of write units, a first interface circuit, a first switch, a plurality of read units, a first compressing circuit, a second compressing circuit, a judging circuit and an interface circuit. The write units are coupled to at least one circuit in the chip and divided into a first group of write units and a second group of write units. The first interface circuit, coupled to the write units, receives a testing signal and transmits the testing signal to the write units to input the testing signal to the circuit in the chip. The first switch is provided between the first group of write units and the second group of write units and is selectively coupled to the first group of write units and the second group of write units. The read units are coupled to at least one circuit in the chip to receive and output the feedback signals of the circuit of the chip and are divided into a first group of read units and a second group of read units. The first group of read units outputs the first group of feedback signals and comprises at least one first feedback signal; and the second group of read units outputs the second group of feedback signals and comprises at least one second feedback signal. The first compressing circuit is coupled to the read units of the first group of read units and compresses the first group of feedback signals outputted by the first group of read units to generate a first compressing signal. The second compressing circuit is coupled to the read units of the second group of read units and compresses the second group of feedback signals outputted by the second group of read units to generate a second compressing signal. The judging circuit is coupled to the first and the second compressing circuits and generates a judging signal selectively according to one of the following signal or combination thereof: the first compressing signal, the second compressing signal, the first feedback signal, and the second feedback signal. The interface circuit is coupled to the judging circuit and generates a test result according to the judging signal to determine whether the chip has defect or not.

The chip testing circuit according to the present invention utilizes the judging unit to do allocation and control without additional interface circuits and connecting points to achieve the purpose of increasing testing throughput per unit time so as to decrease the production cost and increase the testing efficiency.

BRIEF DESCRIPTION OF THE DRAWINGS

FIG. 2 shows the operation truth table of FIG. 1B.

DETAILED DESCRIPTION OF THE INVENTION

Figure 1A:
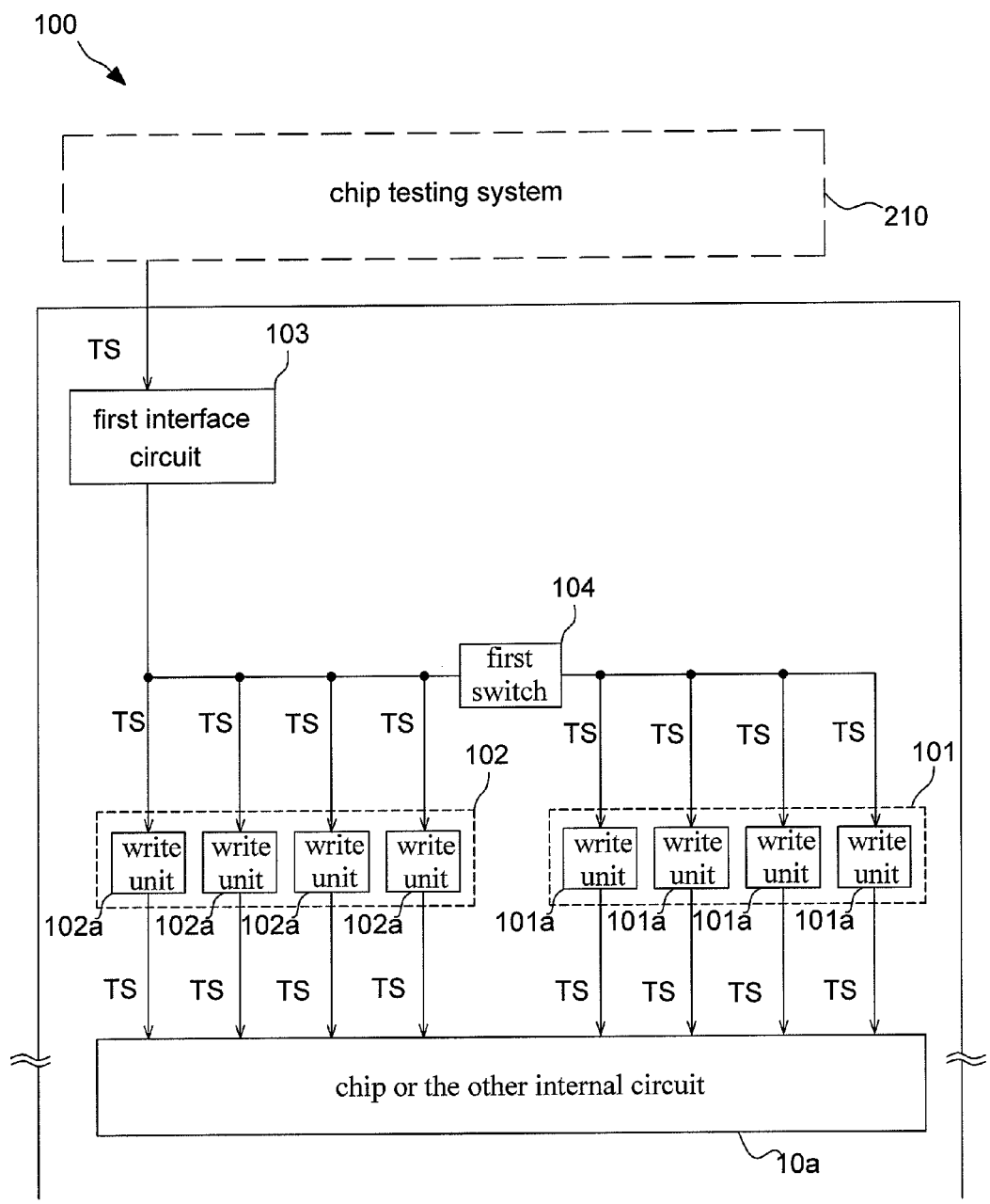
FIG. 1A shows a schematic diagram illustrating a write circuit of the chip testing circuit according to one embodiment of the invention.
Figure 1B:
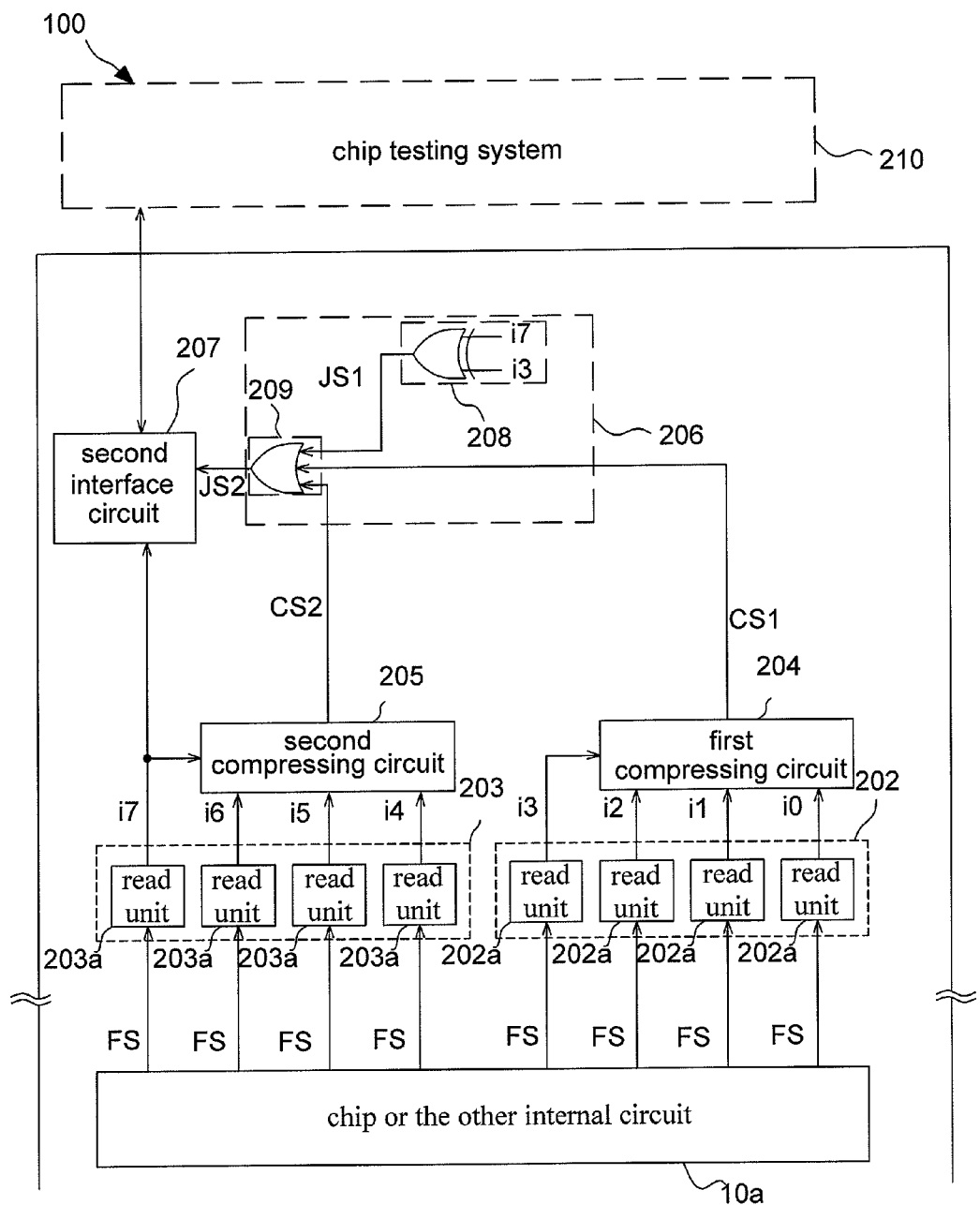
FIG. 1B shows a schematic diagram illustrating a read circuit of the chip testing circuit according to one embodiment of the invention.

FIG. 1A and FIG. 1B show schematic diagrams illustrating the chip testing circuit (chip data compressing test multiplexing circuit) according to one embodiment of the invention. The chip testing circuit 100 according to one embodiment of the invention comprises a write circuit portion to input the testing signal TS to the chip or the other internal circuit 10a, as shown in FIG. 1A and a read circuit portion to receive the feedback signal FS from the chip or the other internal circuit 10a, as shown in FIG. 1B.

As shown in FIG. 1A, the write circuit of the chip testing circuit 100 according to one embodiment of the invention comprises a first write compressing circuit 101, a second write compressing circuit 102, a first interface circuit 103, and a first switch 104.

In this embodiment, the first write compressing circuit 101 and the second write compressing circuit 102 separately comprise four write units, that is, the first group of write units 101a and the second group of write units 102a. But, the present invention is not limited to this example. The number of write units included in the first write compressing circuit 101 and the second write compressing circuit 102 can be adjusted according to the designer. Besides, in one embodiment, the first write compressing circuit 101 and the second write compressing circuit 102 can comprise the same or different number of write units. Each write unit 101a, 102a is coupled to at least one circuit of the chip or the other internal circuit 10a.

The first interface circuit 103 is separately coupled to the write units 101a, 102a in the first write compressing circuit 101 and the second write compressing circuit 102. The first interface circuit 103 receives a testing signal TS inputted by the chip testing system (such as probe card) and transmits the testing signal TS to the write units 101a, 102a to input the testing signal TS to the chip or the other internal circuit 10a.

The first switch 104 is provided between the first write compressing circuit 101 and the second write compressing circuit 102 to be selectively coupled to the first write compressing circuit 101 and the second write compressing circuit 102. In other words, the first switch 104 can be individually coupled to the write unit of the first write compressing circuit 101 or the second write compressing circuit 102. The first switch 104 can also be coupled to the write units of the first write compressing circuit 101 and the second write compressing circuit 102 at the same time.

In one embodiment, the operation method of the write circuit portion according to the invention is as follows. At first, the chip testing system 210 inputs the testing signal TS to the write circuit of the chip testing circuit 100. The first interface circuit 103 receives the testing signal TS and at the same time the chip testing system 210 provides a control signal (not shown) to the first switch 104 to control the first switch 104 to be coupled to the first and the second write compressing circuits 101, 102. In one embodiment, the chip testing system 210 can use the redundancy address to provide the control signal to the first switch 104 to control the operation of the first switch 104. Then, the write units 101a, 102a of the first and the second write compressing circuits 101, 102 separately receive the testing signal TS and write the testing signal TS into the chip or the other internal circuit 10a.

FIG. 1B shows a schematic diagram illustrating a read circuit portion of the chip testing circuit 100 according to one embodiment of the invention. The read circuit of the chip testing circuit 100 comprises a chip or other internal circuit 10a, a first read compressing circuit 202, a second read compressing circuit 203, a first compressing circuit 204, a second compressing circuit 205, a judging circuit 206, and an interface circuit 207.

The first read compressing circuit 202 comprises N read units 202a and is to receive and output the first group of feedback signals transmitted by the chip where N is a positive integer and less than infinity. The second read compressing circuit 203 comprises M read units and is to receive and output the second group of feedback signals transmitted by the chip where M is a positive integer and less than infinity. In this embodiment, the first read compressing circuit 202 and the second read compressing circuit 203 separately comprise four read units, that is, the first group of read units 202a and the second group of read units 203a. But, the present invention is not limited to this example. The number of read units 202a, 203a included in the first read compressing circuit 202 and the second read compressing circuit 203 can be adjusted according to the designer. Besides, in one embodiment, the first read compressing circuit 202 and the second read compressing circuit 203 can comprise the same or different number of read units.

The first read compressing circuit 202 is coupled to the chip or other circuit 10a and is used to read the first group of feedback signals FS transmitted by the chip or other circuit 10a, number the feedback signals to be i0, i1, i2, i3, and then output these feedback signals. The feedback signals i0, i1, i2, i3 are defined as the first feedback signal. The first compressing circuit 204 is coupled to the first read compressing circuit 202 and compresses the first group of feedback signals i0, i1, i2, i3 to generate the first compressing signal CS1.

The second read compressing circuit 203 is coupled to the chip or other circuit 10a and is used to read the second group of feedback signals FS transmitted by the chip or other circuit 10a, number the feedback signals to be i4, i5, i6, i7, and then output these feedback signals. The feedback signals i4, i5, i6, i7 are defined as the second feedback signal. The second compressing circuit 205 is coupled to the second read compressing circuit 203 and compresses the second group of feedback signals i4, i5, i6, i7 to generate the second compressing signal CS2.

The judging circuit 206 is coupled to the first compressing circuit 204 and the second compressing circuit 205 and is used to generate a judging signal JS2 selectively according to one of the following signal or combination thereof: the first compressing signal CS1, the second compressing signal CS2, the first feedback signal, and the second feedback signal. The judging circuit 206 comprises a first calculator 208 and a second calculator 209. The first calculator 208 receives the first feedback signal and the second feedback signal and performs a logic operation on the first feedback signal and the second feedback signal to generate an output signal JS1. The second calculator 209 receives the first compressing signal CS1, the second compressing signal CS2, and the output signal JS1 and performs a logic operation on the first compressing signal CS1, the second compressing signal CS2, and the output signal JS1 to generate the judging signal JS2.

In one embodiment, the first calculator 208 is an exclusive OR gate logic circuit and the second calculator 209 is an OR gate logic circuit. The exclusive OR gate 208 receives any one of the feedback signals in the first group of feedback signals and any one of the feedback signals in the second group of feedback signals generated by the first read compressing circuit 202 and the second read compressing circuit 203 and performs a logic operation to generate the output signal JS1. In this embodiment, the exclusive OR gate 208 receives the first feedback signal i3 and the second feedback signal i7 to perform the logic operation and then generates the output signal JS1. But, the present invention is not limited to this example.

The OR gate 209 is coupled to the first compressing circuit 204, the second compressing circuit 205, and the exclusive OR gate 208 and is used to perform the logic operation on the first compressing signal CS1, the second compressing signal CS2, and the output signal JS1 to generate the judging signal JS2.

Simultaneously referring to FIGS. 1B and 2, FIG. 2 shows the operation truth table of the chip testing circuit of FIG. 1B according to one embodiment of the invention. According to one embodiment of the invention, from the truth table, when the logic values of the feedback signals i0, i1, i2, i3 are the same, that is all 0 or all 1, the logic value of the first compressing signal CS1 is logic 0. When the logic values of the feedback signals i4, i5, i6, i7 are the same, that is all 0 or all 1, the logic value of the second compressing signal CS2 is logic 0. On the other hand, when the logic value of at least one feedback signal in the feedback signals i0, i1, i2, i3 is different from that of the other feedback signal, that is the logic values of the feedback signals i0, i1, i2, i3 are not all 0 or all 1, the logic value of the first compressing signal CS1 is logic 1. When the logic value of at least one feedback signal in the feedback signals i4, i5, i6, i7 is different from that of the other feedback signal, that is the logic values are not all 0 or all 1, the logic value of the second compressing signal CS2 is 1.

For illustration convenience, it is assumed that the chip testing system 210 writes the testing signal with logic 0 into the chip or other internal circuit for testing. Thus, if the chip or other internal circuit functions normally, the logic value returned by the chip or other internal circuit should be also 0 since the logic value of the write-in data is also 0. The following describes the five cases showing the chip testing systems 210 writes the testing signal with logic 0 into the chip or other internal circuit for testing.

In the first case, the test result of the chip or other internal circuit is normal and has no error. When the logic values of the feedback signals i0, i2, i3, i4, i5, i6, i7 returned by the chip or other internal circuit 10a are all 0, the logic values of the first compressing signal CS1 and the second compressing signal CS2 are also 0. Since the output of the exclusive OR gate 208 is based on the feedback signal i3=0 and the feedback signal i7=0, the logic value of the generated output signal JS1 is also 0 after comparing the two data. Then, the OR gate 209 performs the logic operation on the first compressing signal CS1, the second compressing signal CS2, and the output signal JS1. Since the logic values of the first compressing signal CS1, the second compressing signal CS2, and the output signal JS1 are all 0, the logic value of the judging signal JS2 is 0. Finally, the chip testing system 210 receives the judging signal JS2 via the interface circuit 207 and realizes that the chip or other internal circuit 10a is normal and has no error.

In the second case, the test result of the chip or other internal circuit 10a has error(s). When the logic values of the feedback signals i0, i1, i2, i3 returned by the chip or other internal circuit 10a are all 0 but the logic values of the feedback signals i4, i5, i6, i7 are not all 0 and not all 1 (that is, there is data error in the feedback signals i0, i1, i2, i3, i4, i5, i6, i7), the logic value of the first compressing signal CS1 is 0 and the logic value of the second compressing signal CS2 is 1. In the meantime, no matter what the output signal JS1 generated by the exclusive OR gate 208 is, the logic value of the judging signal JS2 generated by the OR gate 209 will always be 1 because the logic value of the second compressing signal CS2 is 1. The interface circuit 207 outputs the data of logic 1 to the chip testing system 210. Therefore, the chip testing system 210 realizes that the chip or other internal circuit 10a has error(s).

In the third case, the test result of the chip or other internal circuit 10a also has error(s). When the logic values of the feedback signals i0, i1, i2, i3 returned by the chip or other internal circuit 10a are not all 0 and not all 1 (that is, there is data error in the feedback signals i0, i1, i2, i3) but the logic values of the feedback signals i4, i5, i6, i7 are all 0, the logic value of the first compressing signal CS1 is 1 and the logic value of the second compressing signal CS2 is 0. In the meantime, no matter what the output signal JS1 generated by the exclusive OR gate 208 is, the logic value of the judging signal JS2 generated by the OR gate 209 will always be 1 because the logic value of the first compressing signal CS1 is 1. The interface circuit 207 outputs the data of logic 1 to the chip testing system 210. Therefore, the chip testing system 210 realizes that the chip or other internal circuit 10a has error(s).

In the fourth case, the test result of the chip or other internal circuit 10a also has error(s). When the logic values of the feedback signals i0, i2, i3 returned by the chip or other internal circuit 10a are all 0 but the logic values of the feedback signals i4, i5, i6, i7 are all 1 (that is, the feedback signals i4, i5, i6, i7 are all incorrect), the logic value of the first compressing signal CS1 is 0 and the logic value of the second compressing signal CS2 is 0. Generally, if the logic values of the first compressing signal CS1 and the second compressing signal CS2 are both 0, the chip testing system 210 determines that the result of the chip or other internal circuit 10a is correct. But, the chip testing circuit 100 uses the exclusive OR gate 208 of the judging circuit 206 to generate the output signal JS1 with logic 1 according to the logic value 0 of the first compressing signal CS1 and the second compressing signal CS2 and thereby the judging signal JS2 outputted by the OR gate 209 becomes logic 1. Thus, the chip testing system 210 realizes that the chip or other internal circuit 10a has error(s) so that correctly judging the chip or other internal circuit 10a can be achieved.

In the fifth case, the test result of the chip or other internal circuit 10a also has error(s). When the logic values of the feedback signals i0, i1, i2, i3 returned by the chip or other internal circuit 10a are all 1 and the logic values of the feedback signals i4, i5, i6, i7 are all 1, the logic value of the first compressing signal CS1 is 0 and the logic value of the second compressing signal CS2 is 0. Since the output of the exclusive OR gate 208 is based on the feedback signal i3=1 and the feedback signal i7=1, the logic value of the generated output signal JS1 is 0. Generally, if the logic values of the first compressing signal CS1, the second compressing signal CS2, and the output signal JS1 are all 0, the chip testing system 210 determines that the result of the chip or other internal circuit 10a is correct. However, the chip testing circuit 100 uses the interface circuit 207 to compare the logic values of the feedback signal i7 and the judging signal JS2. Since the feedback signal i7=1 and the judging signal JS2=0, the interface circuit 207 generates the logic value 1 after comparison. Thus, the chip testing system 210 realizes that the chip or other internal circuit 10a has error(s).

Through the above method, the chip testing circuit according to the embodiments of the invention does not need to increase the number of interface circuits and connecting points to achieve the purpose of increasing the testing throughput per unit time so that the production cost can be reduced and the testing efficiency can be increased.

Figure 3:
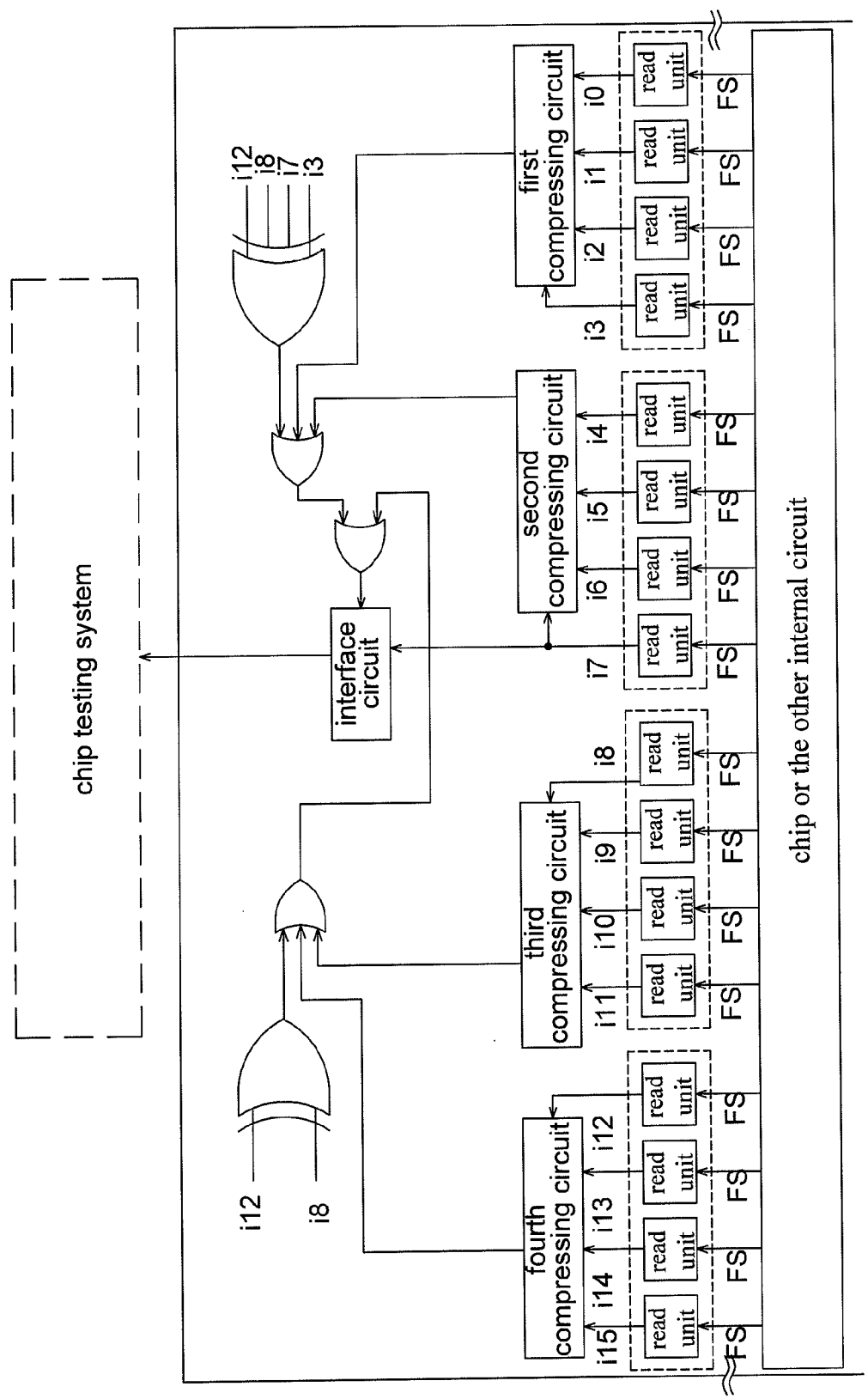
FIG. 3 shows a schematic diagram illustrating the chip testing circuit according to another embodiment of the invention.

Furthermore, the chip testing circuit according to the embodiments of the invention can be developed to have a N-terminal input signal compressing method. For example, as shown in FIG. 3, the read circuit of the chip testing circuit uses a 16-terminal input signal compressing method. The chip testing circuit uses two exclusive OR gates and three OR gates to perform logic operations to separately process the data read by the read units of the four read compressing circuits and thereby to determine the state of the circuits in the chip. It should be noted that those who are skilled in the art should understand the architecture of the write circuit portion of the chip testing circuit can be implemented by allocating three switches from the above description and FIG. 3. By the above method, the chip testing circuit only needs to use one interface circuit and one pin to connect to the probe of the chip testing system to achieve the purpose of receiving 16 feedback signals. Thus, the chip testing efficiency can be increased and the chip testing cost can be reduced.

It should be noted that the chip according to the embodiments of the invention can be a memory element, a semiconductor device comprising a memory element, or a logic element. In addition, the chip can be of a wafer form, a die form, or a chip package form. The chip testing circuit according to the embodiments of the invention is complied with a repair algorithm.

Although the present invention has been fully described by the above embodiments, the embodiments should not constitute the limitation of the scope of the invention. Various modifications or changes can be made by those who are skilled in the art without deviating from the spirit of the invention.

What is claimed is:
1. A chip testing circuit, comprising:
a first compressing circuit, for generating a first compressing signal according to a first group of feedback signals outputted by the chip wherein the first group of feedback signals comprises a first feedback signal;
a second compressing circuit, for generating a second compressing signal according to a second group of feedback signals outputted by the chip wherein the second group of feedback signals comprises a second feedback signal;
a judging circuit, coupled to the first and the second compressing circuits, for generating a judging signal selectively according to one of the following signals or combination thereof: the first compressing signal, the second compressing signal, the first feedback signal, and the second feedback signal; and
an interface circuit, coupled to the judging circuit and receiving the first feedback signal or the second feedback signal, for generating a test result according to a comparison between the judging signal and the first feedback signal or the second feedback signal to determine whether the chip has a defect or not.

2. The chip testing circuit according to claim 1, further comprising:
a first read compressing circuit, comprising N read units, for receiving and outputting the first group of feedback signals transmitted by the chip wherein N is a positive integer and less than infinity; and
a second read compressing circuit, comprising M read units, for receiving and outputting the second group of feedback signals transmitted by the chip wherein M is a positive integer and less than infinity.

3. The chip testing circuit according to claim 2, wherein the number N is equal to the number M.

4. The chip testing circuit according to claim 2, wherein the number N is equal to the number M and is equal to 4.

5. The chip testing circuit according to claim 2, wherein the number N is not equal to the number M.

6. The chip testing circuit according to claim 1, wherein the chip is a memory element, a semiconductor device comprising a memory element, or a logic element.

7. The chip testing circuit according to claim 1, wherein the chip is of a wafer form, a die form, or a chip package form.

8. The chip testing circuit according to claim 1, being complied with a repair algorithm.

9. A chip testing circuit, comprising:
a first compressing circuit, for generating a first compressing signal according to a first group of feedback signals outputted by the chip wherein the first group of feedback signals comprises a first feedback signal;
a second compressing circuit, for generating a second compressing signal according to a second group of feedback signals outputted by the chip wherein the second group of feedback signals comprises a second feedback signal;
a judging circuit, coupled to the first and the second compressing circuits, for generating a judging signal selectively according to one of the following signals or combination thereof: the first compressing signal, the second compressing signal, the first feedback signal, and the second feedback signal; and
an interface circuit, coupled to the judging circuit, for generating a test result according to the judging signal to determine whether the chip has a defect or not;
a first calculator, for separately receiving the first feedback signal and the second feedback signal and performing a logic operation on the first feedback signal and the second feedback signal to generate an output signal; and
a second calculator, for receiving the first compressing signal, the second compressing signal, and the output signal and performing a logic operation on the first compressing signal, the second compressing signal, and the output signal to generate the judging signal.

10. The chip testing circuit according to claim 9, wherein the first calculator is an exclusive OR gate logic circuit and the second calculator is an OR gate logic circuit.

11. A chip testing circuit, comprising:
a plurality of write units, coupled to at least one circuit in the chip and divided into a first group of write units and a second group of write units;
a first interface circuit, coupled to the write units, for receiving a testing signal and transmitting the testing signal to the write units to input the testing signal to the circuit in the chip;
a first switch, provided between the first group of write units and the second group of write units to be selectively coupled to the first group of write units and the second group of write units;
a plurality of read units, coupled to at least one circuit in the chip to receive and output the feedback signals of the circuit of the chip and divided into a first group of read units and a second group of read units wherein the first group of read units outputs the first group of feedback signals and comprises at least one first feedback signal; and the second group of read units outputs the second group of feedback signals and comprises at least one second feedback signal;
a first compressing circuit, coupled to the read units of the first group of read units, for compressing the first group of feedback signals outputted by the first group of read units to generate a first compressing signal;
a second compressing circuit, coupled to the read units of the second group of read units, for compressing the second group of feedback signals outputted by the second group of read units to generate a second compressing signal;
a judging circuit, coupled to the first and the second compressing circuits, for generating a judging signal selectively according to one of the following signal or combination thereof: the first compressing signal, the second compressing signal, the first feedback signal, and the second feedback signal; and
an interface circuit, coupled to the judging circuit, for generating a test result according to the judging signal to determine whether the chip has defect or not.

12. The chip testing circuit according to claim 11, wherein the interface circuit further generates the test result according to the first feedback signal or the second feedback signal and the judging signal.

13. The chip testing circuit according to claim 11, wherein the judging circuit comprises:
a first calculator, for separately receiving the first feedback signal and the second feedback signal and performing a logic operation on the first feedback signal and the second feedback signal to generate an output signal; and
a second calculator, for receiving the first compressing signal, the second compressing signal, and the output signal and performing a logic operation on the first compressing signal, the second compressing signal, and the output signal to generate the judging signal.

14. The chip testing circuit according to claim 13, wherein the first calculator is an exclusive OR gate logic circuit and the second calculator is an OR gate logic circuit.

15. The chip testing circuit according to claim 11, wherein the chip is a memory element, a semiconductor device comprising a memory element, or a logic element.

16. The chip testing circuit according to claim 11, wherein the chip is of a wafer form, a die form, or a chip package form.

17. The chip testing circuit according to claim 11, being complied with a repair algorithm.

18. The chip testing circuit according to claim 11, wherein the logic value of the first compressing signal is 0 as the logic value of every feedback signal in the first group of the feedback signals is the same, and/or the logic value of the second compressing signal is 1 as the logic value of every feedback signal in the second group of the feedback signals is the same.

19. The chip testing circuit according to claim 11, wherein the logic value of the first compressing signal is 1 as the logic value of one feedback signal is different from that of the other feedback signals in the first group of the feedback signals, and/or the logic value of the second compressing signal is 1 as the logic value of one feedback signal is different from that of the other feedback signals in the second group of the feedback signals.

* * * * *